(12) United States Patent
Trautmann et al.

(10) Patent No.: US 9,111,787 B2
(45) Date of Patent: Aug. 18, 2015

(54) ARRANGEMENT OF TWO SUBSTRATES HAVING AN SLID BOND AND METHOD FOR PRODUCING SUCH AN ARRANGEMENT

(75) Inventors: Achim Trautmann, Leonberg (DE); Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 131 days.

(21) Appl. No.: 13/133,521

(22) PCT Filed: Oct. 19, 2009

(86) PCT No.: PCT/EP2009/063675
§ 371 (c)(1),
(2), (4) Date: Jun. 8, 2011

(87) PCT Pub. No.: WO2010/066494
PCT Pub. Date: Jun. 17, 2010

(65) Prior Publication Data
US 2011/0233750 A1    Sep. 29, 2011

(30) Foreign Application Priority Data

Dec. 9, 2008 (DE) .......................... 10 2008 054 415

(51) Int. Cl.
*H01L 21/58* (2006.01)
*H01L 23/10* (2006.01)
(Continued)

(52) U.S. Cl.
CPC ............ *H01L 23/10* (2013.01); *B81C 1/00269* (2013.01); *B81B 2207/012* (2013.01); *B81C 2203/0109* (2013.01); *B81C 2203/038* (2013.01); *H01L 2924/0002* (2013.01); *H01L 2924/1433* (2013.01)

(58) Field of Classification Search
CPC ............... H01L 2224/165–2224/16503; H01L 2924/0105; H01L 2924/01013; H01L 2224/15–2224/16; H01L 2224/16135; H01L 2224/16141; H01L 2224/16145; B81C 2203/01–2203/0118; C22C 1/026; C22C 21/00; C22C 13/00
USPC ................ 438/108, 119, 406, 455, 612–616; 257/778–780, E21.511, 257/E21.508–E21.509
See application file for complete search history.

(56) References Cited

U.S. PATENT DOCUMENTS 4,081,824 A * 3/1978 Keramidas .................... 257/743
5,106,009 A * 4/1992 Humpston et al. ............ 228/195
(Continued)

FOREIGN PATENT DOCUMENTS

| CN | 1172547 A | 2/1998 |
| CN | 101248340 A | 8/2008 |
| DE | 102006019080 | 8/2007 |

OTHER PUBLICATIONS

Composition and Heat-Treatment Effects on the Adhesion Strength of Sn—Zn—Al Solders on Cu Substrate, Shan-Pu Yu, Hsin-Chien Wang, Min-Hsiung Hon, and Moo-Chin Wang, 2000.*
(Continued)

*Primary Examiner* — William F Kraig
*Assistant Examiner* — Maliheh Malek
(74) *Attorney, Agent, or Firm* — Maginot, Moore & Beck LLP

(57) ABSTRACT

An arrangement having a first and a second substrate is disclosed, wherein the two substrates are connected to one another by means of an SLID (Solid Liquid InterDiffusion) bond. The SLID bond exhibits a first metallic material and a second metallic material, wherein the SLID bond comprises the intermetallic Al/Sn-phase.

14 Claims, 1 Drawing Sheet

(51) Int. Cl.
*B81C 1/00* (2006.01)
*H01L 21/447* (2006.01)

(56) References Cited

U.S. PATENT DOCUMENTS

| | | | | |
|---|---|---|---|---|
| 5,234,152 | A * | 8/1993 | Glaeser | 228/121 |
| 5,366,692 | A * | 11/1994 | Ogashiwa | 420/565 |
| 5,452,842 | A * | 9/1995 | Melton et al. | 228/180.22 |
| 5,551,627 | A * | 9/1996 | Leicht et al. | 228/180.22 |
| 5,561,079 | A * | 10/1996 | Partin | 438/498 |
| 5,833,758 | A * | 11/1998 | Linn et al. | 134/1.2 |
| 5,856,705 | A * | 1/1999 | Ting | 257/758 |
| 5,897,341 | A | 4/1999 | Love et al. | |
| 6,057,234 | A * | 5/2000 | Yamazaki | 438/660 |
| 6,383,661 | B2 * | 5/2002 | Wittebrood et al. | 428/650 |
| 6,492,255 | B2 * | 12/2002 | Enomoto et al. | 438/614 |
| 6,613,121 | B2 * | 9/2003 | Takayama et al. | 75/247 |
| 6,772,936 | B2 * | 8/2004 | Polvi | 228/246 |
| 6,793,829 | B2 * | 9/2004 | Platt et al. | 216/2 |
| 6,994,919 | B2 * | 2/2006 | Wijenberg et al. | 428/650 |
| 7,248,141 | B2 * | 7/2007 | Kobayashi et al. | 337/232 |
| 7,261,760 | B2 * | 8/2007 | Ishida et al. | 75/255 |
| 7,642,115 | B2 * | 1/2010 | Eriksen et al. | 438/51 |
| 7,846,830 | B2 * | 12/2010 | Takewaki et al. | 438/614 |
| 7,969,018 | B2 * | 6/2011 | Otremba et al. | 257/777 |
| 8,091,764 | B2 * | 1/2012 | Suga et al. | 228/180.21 |
| 8,242,569 | B2 * | 8/2012 | Rothacher | 257/415 |
| 8,286,854 | B2 * | 10/2012 | Rettig et al. | 228/193 |
| 8,742,600 | B2 * | 6/2014 | Chang et al. | 257/782 |
| 2001/0029095 | A1 | 10/2001 | Tadauchi et al. | 438/612 |
| 2002/0089828 | A1 * | 7/2002 | Suzuki et al. | 361/709 |
| 2003/0160021 | A1 | 8/2003 | Platt | |
| 2004/0084509 | A1 * | 5/2004 | Meyer et al. | 228/194 |
| 2004/0115468 | A1 * | 6/2004 | Wijenberg et al. | 428/647 |
| 2005/0124159 | A1 * | 6/2005 | Kalvesten et al. | 438/689 |
| 2005/0227474 | A1 * | 10/2005 | Mizukoshi et al. | 438/612 |
| 2006/0151871 | A1 * | 7/2006 | Mehrotra | 257/705 |
| 2007/0114662 | A1 * | 5/2007 | Helneder et al. | 257/737 |
| 2007/0205253 | A1 * | 9/2007 | Hubner | 228/193 |
| 2008/0160752 | A1 * | 7/2008 | Clevenger et al. | 438/614 |
| 2008/0315423 | A1 * | 12/2008 | Schneegans et al. | 257/762 |
| 2009/0045444 | A1 * | 2/2009 | Huebner | 257/296 |
| 2009/0108421 | A1 * | 4/2009 | Nelle et al. | 257/669 |
| 2010/0044091 | A1 * | 2/2010 | Taniguchi et al. | 174/261 |
| 2010/0055846 | A1 * | 3/2010 | Lii et al. | 438/124 |
| 2010/0155914 | A1 * | 6/2010 | Lim et al. | 257/675 |
| 2010/0230810 | A1 * | 9/2010 | Kang et al. | 257/737 |
| 2010/0263849 | A1 * | 10/2010 | Nakano et al. | 165/185 |
| 2011/0121414 | A1 * | 5/2011 | Rothacher | 257/416 |
| 2011/0180887 | A1 * | 7/2011 | Rothacher | 257/415 |
| 2011/0315315 | A1 * | 12/2011 | Garnier | 156/285 |
| 2012/0052313 | A1 * | 3/2012 | Sibuet et al. | 428/457 |
| 2012/0061811 | A1 * | 3/2012 | Nelle et al. | 257/669 |
| 2012/0112201 | A1 * | 5/2012 | Otsuka et al. | 257/76 |
| 2012/0187509 | A1 * | 7/2012 | Gottfried et al. | 257/417 |
| 2012/0291543 | A1 * | 11/2012 | Rettig et al. | 73/488 |
| 2012/0292773 | A1 * | 11/2012 | Hosseini et al. | 257/761 |
| 2012/0319303 | A1 * | 12/2012 | Foster et al. | 257/787 |
| 2013/0089955 | A1 * | 4/2013 | Baillin et al. | 438/115 |
| 2015/0061118 | A1 * | 3/2015 | Chen et al. | 257/737 |

OTHER PUBLICATIONS

"Cu/Sn Solid-Liquid Interdiffusion Bonding", A. Munding, H. Hubner, A. Kaiser, S. Penkar, P. Benkart, and E. Kohn, University of ULM, Germany, Springer Science+Business Media, 2008, pp. 131-169.*

"Liquid Phase Sintering of Aluminum Alloys", G.B. Schaffer, T.B. Sercombe, R.N. Lumley, University of Queensland, Brisbane, Australia, 2001, Elsevier Materials Chemistry and Physics, pp. 85-91.*

Bernstein L: "Semiconductor Joining by the Solid-Liquid-Interdiffusion (SLID) Process", Journal of the Electrochemical Society, Electrochemical Society, Manchester, New Hampshire, US vol. 113, No. 12, Dec. 1, 1966 pp. 1282-1288, XP001040800, ISSN: 0013-4651 (7 pages).

International Search Report corresponding to PCT Application No. PCT/EP2009/063675, mailed Dec. 30, 2010 (German and English language document) (7 pages).

* cited by examiner

ARRANGEMENT OF TWO SUBSTRATES HAVING AN SLID BOND AND METHOD FOR PRODUCING SUCH AN ARRANGEMENT

This application is a 35 U.S.C. §371 National Stage Application of PCT/EP2009/063675, filed Oct. 19, 2009, which claims the benefit of priority to Serial No. DE 10 2008 054 415.9, filed Dec. 9, 2008 in Germany, the disclosures of which are incorporated herein by reference in their entirety.

BACKGROUND

The disclosure relates to an arrangement of two substrates, which are connected to one another by means of an SLID (solid-liquid interdiffusion) bond, and to a method for producing such an arrangement.

In order to connect two substrates to one another, it is known firstly to provide these with bonding materials and then to carry out a bonding process. One possible bonding process consists in the use of the so-called SLID technology. The SLID technology is based on the selection of two suitable metals with melting points of different magnitudes as the bonding materials, where the two metals together form a stable alloy having a melting point which is higher than the lower melting point of the two starting metals. During the bonding process, the two bonding materials are moved into contact and heated to above the melting temperature of the lower melting point, such that the metal with the lower melting point melts and diffuses into the higher-melting metal. In this case, the desired, solid alloy forms on the boundary layer. The lower-melting metal ideally melts entirely and is converted completely into the newly formed alloy.

The use of such an SLID bond between two substrates is described, for example, in DE 10 2006 019 080 B3. This document proposes the use of tin (Sn) as the first metal with the lower melting temperature and copper (Cu) as the second metal with the higher melting temperature. Upon heating to above the melting temperature of tin, tin diffuses into the copper and thereby forms an alloy having a melting point which is higher than that of tin. According to this document, a solid metallic bond has formed after a duration of several minutes.

However, the Cu/Sn material selection known from the prior art is not always possible or is possible only with major additional expenditure. For example, it is often the case that many known semiconductor processes are already optimized for specific metallic materials, and therefore a simple adoption of the SLID technology known from the prior art in existing semiconductor processes cannot be realized.

There is therefore a need to provide a modified SLID technology which can also be easily introduced into existing semiconductor processes in which the material selection known to date requires major expenditure for adaptation.

SUMMARY

The arrangement according to the disclosure or the method for producing such an arrangement has the advantage that it is easily possible to obtain a stable bond between two substrates, without having to thereby expensively convert the existing production processes.

It is beneficial that the advantages of an SLID bond are completely retained and also that there is no need to intervene substantially in existing processes for this purpose. Overall, this results in a cost-effective method for producing the desirable arrangement of two substrates, which is of major importance for industrial manufacturing.

Advantageous developments of the disclosure are described below.

BRIEF DESCRIPTION OF THE DRAWING

Exemplary embodiments of the disclosure are explained in more detail with reference to the drawings and the description which follows.

DETAILED DESCRIPTION

Figure 1:
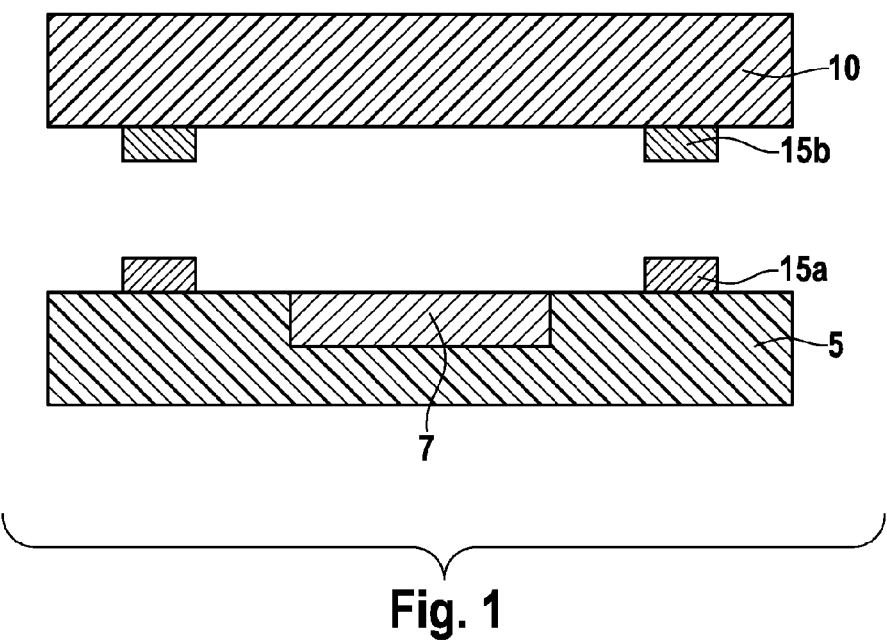
FIG. 1 shows an exemplary embodiment of the two substrates to be connected before the bonding process in cross section.
Figure 2:
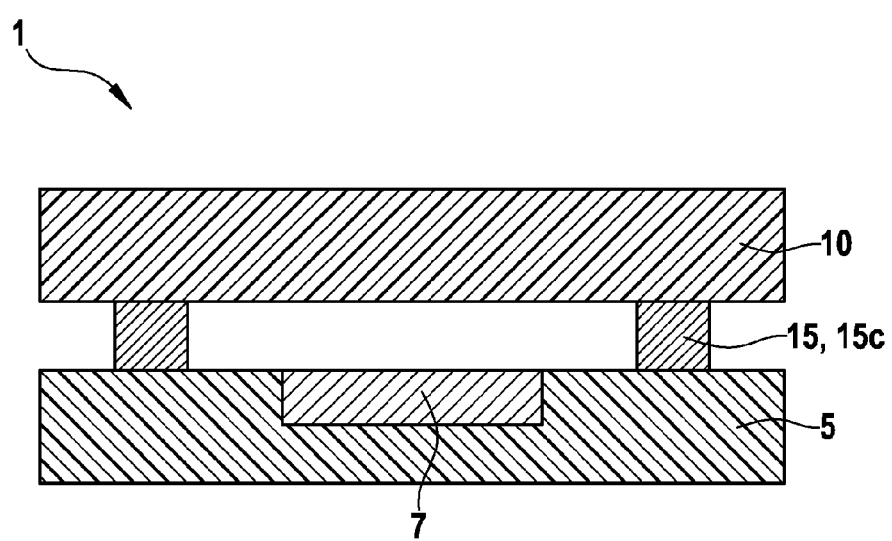
FIG. 2 shows the two substrates from FIG. 1 after the bonding process in cross section.

The method according to the disclosure for producing an arrangement having a first substrate and a second substrate which are connected to one another by means of an SLID (solid-liquid interdiffusion) bond is explained on the basis of FIGS. 1 and 2. In principle, the method comprises the following steps provided in succession:

a) a first substrate 5 and a second substrate 10 are provided, b) a first bonding material 15a comprising a first metallic material is applied to the first substrate 5 and a second bonding material 15b comprising a second metallic material is applied to the second substrate 10, wherein the metallic materials selected are Al and Sn, and c) a bonding process is carried out with the two substrates 5, 10, as a result of which an SLID (solid-liquid interdiffusion) bond 15 comprising an intermetallic Al/Sn phase 15c is obtained.

In the method according to the disclosure, aluminum (Al) and tin (Sn) are advantageously selected as the material combination for bonding. The disclosure is based on the novel understanding that this material combination represents a very suitable starting point for an SLID bond to be formed. Firstly, this material combination can be used to produce a stable SLID bond to the intermetallic Al/Sn phase 15c. Secondly, a very large number of semiconductor processes are tailored to the application specifically of aluminum as the preferred metal to substrates. In the method according to the disclosure, it is thus not necessary to replace the familiar metalization of the substrate by aluminum with another metal, for example copper, in order to obtain an SLID bond 15.

Here, aluminum is preferably applied as the first metallic material to the first substrate 5. On the other hand, tin is preferably applied as the second metallic material to the second substrate 10.

Therefore, the first bonding material 15a comprises Al as the first metallic material. Here, bonding material 15a can provide Al for the later intermetallic Al/Sn phase 15c either as pure Al or else also as an Al alloy. A suitable Al alloy for this purpose is AlSi, AlCu or AlSiCu.

In addition, a further layer of Al or Cu (not shown in the figures) can be arranged between the second substrate 10 and tin, the second metallic material in the second bonding material 15b, in step b). This then produces the layer sequence substrate/Al/Sn or substrate/Cu/Sn. It is important that the Sn layer always forms the outermost layer.

The advantage of the disclosure becomes particularly clear if a MEMS (microelectromechanical system) wafer is provided as the first substrate 5 in step a), as outlined in the exemplary embodiment according to FIG. 1. Here, a MEMS wafer comprises at least one MEMS structure 7. If it were desired to carry out the SLID bonding process known from the prior art in the case of the MEMS wafer known to date, the series production of which is tailored to aluminum as metallic layers on the wafer, complicated interventions in the MEMS process itself would be required.

It is further proposed that a cap wafer is provided as the second substrate 10 in step a). The method according to the disclosure then therefore serves for capping a MEMS wafer by means of a second wafer 10. The second substrate 10, either in addition to the function as a cap wafer or else without the function as a cap wafer, can be in the form of a substrate 10 with electronic components (not shown in the figures). By way of example, the second substrate 10 can thus be a cap wafer and at the same time an ASIC (application-specific integrated circuit) wafer. During the bonding process, an electrical connection could therefore also be produced at the same time between the MEMS wafer and the cap wafer, since the intermetallic Al/Sn phase 15c produced has good electrical conductivity.

In addition, Sn layers can be applied to the cap wafer by various methods, for example by "tin-plating" or by "solder dispensing". Both methods are simple and cost-effective.

Furthermore, it is advantageous if a respective continuous bonding frame is formed in step b) by the application of the bonding materials 15a, 15b to the two substrates 5, 10. An SLID bond 15 in the form of a continuous bonding frame is then realized as a result of the later bonding process.

Furthermore, it is recommended that a respective bonding layer having a layer thickness in the range of 100 nm to 10 µm is formed in step b) by the application of the two bonding materials 15a, 15b. These layer thicknesses firstly provide sufficient material for a stable SLID bond to be formed, and secondly said thickness range ensures a certain variation of the layer thicknesses, which can be of a different magnitude depending on the specific requirement.

Finally, it is proposed that a process temperature T in the range of 230° C. to 300° C. can be selected when the bonding process is being carried out in step c). This temperature range is suitable since firstly it already suffices to bring about melting of the tin bonding material 15b. Secondly, the temperature range is not too high, since the connection to be formed has a much higher melting point, of about 400° C., even given a very low Al content of 10% by weight. The connection formed therefore has a much higher melting point and is therefore very thermally stable.

After the method according to the disclosure has been carried out, the result obtained is an arrangement 1 having a first substrate 5 and a second substrate 10 which are connected to one another by means of an SLID (solid-liquid interdiffusion) bond 15, wherein the SLID bond 15 comprises a first metallic material and a second metallic material in the form of the intermetallic Al/Sn phase 15c.

The intermetallic Al/Sn phase 15c should preferably have an Al content of at least 10% by weight since, as described above, an already very high melting point is then obtained. The exact content can advantageously be set easily by the corresponding layer thicknesses of the first bonding material 15a and of the second bonding material 15b.

The invention claimed is:

1. An arrangement having a first substrate and a second substrate which are connected to one another by an SLID (solid-liquid interdiffusion) bond,
   wherein the SLID bond comprises a first metallic material and a second metallic material,
   wherein the SLID bond comprises an intermetallic Al/Sn phase,
   wherein the intermetallic Al/Sn phase has an Al content of at least 10% by weight, and
   wherein the intermetallic Al/Sn phase is formed such that all of the first metallic material and all of the second metallic material are in contact with both the first substrate and the second substrate.

2. The arrangement as claimed in claim 1, wherein the first substrate is a MEMS (microelectromechanical system) wafer.

3. The arrangement as claimed in claim 1, wherein the second substrate is a cap wafer and/or an ASIC (application-specific integrated circuit) wafer.

4. The arrangement as claimed in claim 1, wherein a continuous bonding frame is formed by the SLID bond.

5. The arrangement as claimed in claim 1, wherein the first metallic material Al in the intermetallic Al/Sn phase is provided from pure Al or from an Al alloy.

6. A method for producing an arrangement having a first substrate and a second substrate which are connected to one another by an SLID (solid-liquid interdiffusion) bond, comprising:
   a) applying a first bonding material comprising a first metallic material directly onto the first substrate and applying a second bonding material comprising a second metallic material directly onto the second substrate, wherein the metallic materials applied to the first substrate and the second substrate are Al and Sn, and
   b) carrying out a bonding process with the two substrates so that an SLID (solid-liquid interdiffusion) bond comprising an intermetallic Al/Sn phase is obtained that extends between and contacts both the first substrate and the second substrate,
   wherein the first bonding material applied to the first substrate is Al alloy, and
   wherein the second bonding material applied to the second substrate is Sn.

7. The method as claimed in claim 6, wherein the first bonding material and the second bonding material are applied to the first substrate and the second substrate, respectively, to a thickness in a range of 100 nm to 10 µm.

8. The method as claimed in claim 6, wherein a respective continuous bonding frame is formed in step a) by the application of the bonding materials to the two substrates.

9. The method as claimed in claim 6, wherein the Al alloy selected in step a) is AlSi, AlCu or AlSiCu.

10. The method as claimed in claim 6, wherein a process temperature in the range of 230° C. to 300° C. is utilized when the bonding process is being carried out in step b).

11. The arrangement as claimed in claim 5, wherein the Al alloy is one of AlSi, AlCu, and AlSiCu.

12. The method of claim 6, wherein step a) is performed before step b).

13. The method as claimed in claim 6, wherein the first substrate is a MEMS (microelectromechanical system) wafer.

14. The method as claimed in claim 6, wherein the second substrate is a cap wafer and/or an ASIC (application-specific integrated circuit) wafer.

* * * * *